(12) United States Patent
Dellaert et al.

(10) Patent No.: US 8,562,799 B2
(45) Date of Patent: Oct. 22, 2013

(54) FLAT END-BLOCK FOR CARRYING A ROTATABLE SPUTTERING TARGET

(75) Inventors: Krist Dellaert, Zottegem (BE); Wilmert De Bosscher, Drongen (BE); Joannes De Boever, Deinze (BE); Gregory Lapeire, Moorsele (BE)

(73) Assignee: Soleras Advanced Coatings BVBA, Deinze (BE)

( * ) Notice: Subject to any disclaimer, the term of this patent is extended or adjusted under 35 U.S.C. 154(b) by 907 days.

(21) Appl. No.: 11/665,562

(22) PCT Filed: Oct. 11, 2005

(86) PCT No.: PCT/EP2005/055143
§ 371 (c)(1),
(2), (4) Date: Nov. 9, 2007

(87) PCT Pub. No.: WO2006/097152
PCT Pub. Date: Sep. 21, 2006

(65) Prior Publication Data
US 2008/0105543 A1    May 8, 2008

(30) Foreign Application Priority Data

Oct. 18, 2004 (EP) .................................... 04105116
Mar. 11, 2005 (EP) .................................... 05101905

(51) Int. Cl.
*C23C 14/00* (2006.01)
*C25B 11/00* (2006.01)
*C25B 13/00* (2006.01)

(52) U.S. Cl.
USPC .................. 204/298.12; 204/298.21

(58) Field of Classification Search
USPC ........................... 204/298.15, 298.12, 298.21
See application file for complete search history.

(56) References Cited

U.S. PATENT DOCUMENTS

| 3,878,085 A | 4/1975 | Corbani |
| 4,356,073 A | 10/1982 | McKelvey |
| 4,422,916 A | 12/1983 | McKelvey |

(Continued)

FOREIGN PATENT DOCUMENTS

| EP | 1 106 893 A1 | 6/2001 |
| EP | 1 092 109 B1 | 5/2002 |

(Continued)

OTHER PUBLICATIONS

Dellaert et al., USPTO Office Action, U.S. Appl. No. 11/908,017, filed Nov. 24, 2010, 15 pages.

(Continued)

*Primary Examiner* — Keith Hendricks
*Assistant Examiner* — Ibrahime A Abraham
(74) *Attorney, Agent, or Firm* — Foley & Lardner LLP

(57) ABSTRACT

An end-block for use in a tubular magnetron sputtering apparatus is disclosed. Such an end-block rotatably transfers movement, coolant 5 and electrical current to the target while maintaining vacuum integrity and a closed coolant circuit. It hence comprises a drive means, a rotary electrical contact means, a bearing means, a number of rotary coolant seal means and a number of vacuum seal means. The inventive end-block occupies a minimal axial length along the target thus allowing 10 space savings in existing equipment such as e.g. display coaters. The axial length is reduced by mounting at least two of the means radial to one another.

24 Claims, 4 Drawing Sheets

(56) References Cited

U.S. PATENT DOCUMENTS

| | | | |
|---|---|---|---|
| 4,443,318 A | | 4/1984 | McKelvey |
| 4,445,997 A | | 5/1984 | McKelvey |
| 4,519,885 A | * | 5/1985 | Innis .................. 204/192.12 |
| 4,575,102 A | * | 3/1986 | Raj et al. .................. 277/410 |
| 4,995,958 A | | 2/1991 | Anderson et al. |
| 5,096,562 A | | 3/1992 | Boozenny et al. |
| 5,200,049 A | | 4/1993 | Stevenson et al. |
| 5,445,721 A | * | 8/1995 | Bower .................. 204/192.12 |
| 5,470,452 A | | 11/1995 | Dickey et al. |
| 5,591,314 A | | 1/1997 | Morgan et al. |
| 5,620,577 A | | 4/1997 | Taylor |
| 5,725,746 A | | 3/1998 | Dickey et al. |
| 6,263,542 B1 | * | 7/2001 | Larson et al. .................. 16/321 |
| 6,322,679 B1 | | 11/2001 | De Bosscher et al. |
| 6,365,010 B1 | * | 4/2002 | Hollars .................. 204/192.12 |
| 6,375,815 B1 | | 4/2002 | Lynn et al. |
| 6,488,824 B1 | | 12/2002 | Hollars et al. |
| 6,736,948 B2 | * | 5/2004 | Barrett .................. 204/298.22 |
| 2003/0136672 A1 | | 7/2003 | Barrett |
| 2003/0173217 A1 | | 9/2003 | Crowley |
| 2005/0178662 A1 | | 8/2005 | Wurczinger |
| 2006/0157346 A1 | * | 7/2006 | Cnockaert et al. ....... 204/298.12 |
| 2008/0202925 A1 | | 8/2008 | Dellaert et al. |

FOREIGN PATENT DOCUMENTS

| | | |
|---|---|---|
| JP | 2002-529600 A | 9/2002 |
| WO | WO 92/02660 A1 | 2/1992 |
| WO | WO 00/28104 A1 | 5/2000 |
| WO | WO 02/38826 A1 | 5/2002 |
| WO | WO 03/080891 A1 | 10/2003 |
| WO | WO 2004/085902 A1 | 10/2004 |
| WO | WO 2005/005682 A1 | 1/2005 |

OTHER PUBLICATIONS

Krist Dellaert et al., USPTO Office Action, U.S. Appl. No. 11/908,017, filed Apr. 11, 2011, 13 pages.

USPTO Office Action, U.S. Appl. No. 11/908,017, filed Jan. 3, 2012, 15 pages.

USPTO Office Action, U.S. Appl. No. 11/908,017, filed May 3, 2012, 13 pages.

* cited by examiner

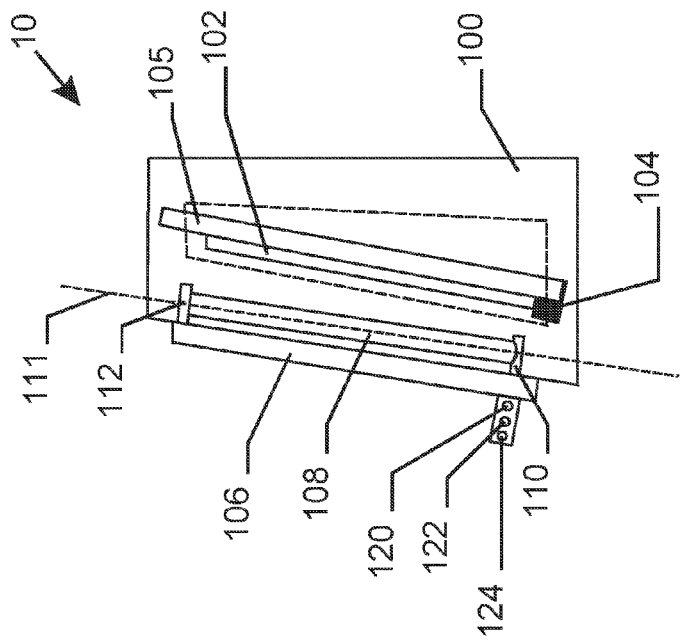
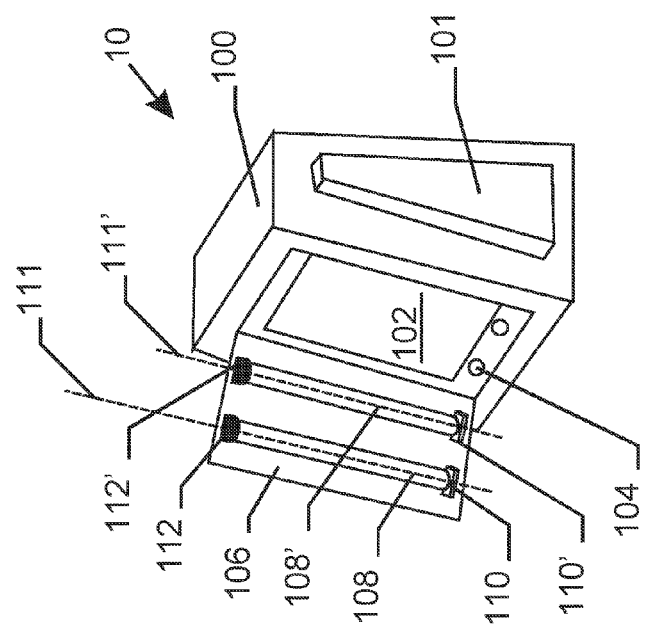
Fig. 1a
Fig. 1b

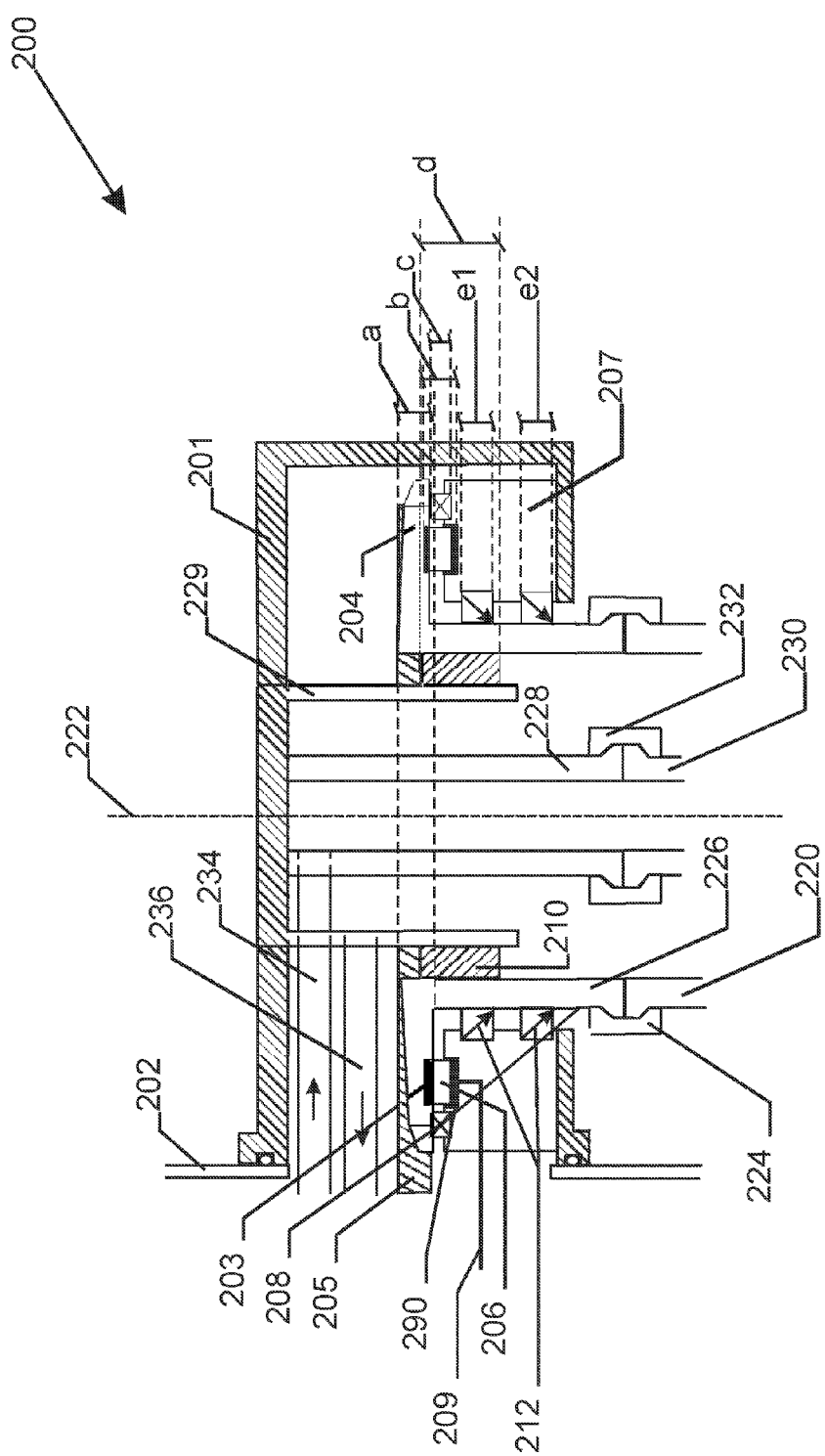

FLAT END-BLOCK FOR CARRYING A ROTATABLE SPUTTERING TARGET

FIELD OF THE INVENTION

The invention relates to an end-block that is used to rotatably carry a sputtering target in a sputtering apparatus. More in particular it relates to end-blocks that are relatively flat when considered along the symmetry axis of the target, while still housing inside all or some of the necessary means to energise, cool, seal, support and rotate the target.

BACKGROUND OF THE INVENTION

Sputtering material from a target to cover a substrate has become common practice in a wide range of technical fields such as integrated circuit manufacture, large area glass coating and nowadays more and more for the coating of flat panel displays. Such sputtering takes place under a reduced pressure atmosphere wherein sputtering or reactive gases or mixtures of both are admitted in a controlled way. Free electrons hopping in a magnetically confined racetrack ionise the gas atoms or molecules in the vicinity of the target surface. These ions are subsequently accelerated towards the target that is negatively biased, thereby dislodging the target atoms and giving them enough kinetic energy to reach the substrate and coat it. The shape of the racetrack is defined by a static magnetic array, close to that target surface that is opposite to the surface that is being sputtered. Such a deposition process is commonly called "magnetron sputtering" due to the presence of the magnetic array.

A plethora of apparatus has been developed, designed and built with a specific application in mind. The first, smaller magnetron sputtering apparatus used stationary planar targets initially prevalently circular in form (i.e. like the silicon wafer that was sputtered upon). Later also elongated, rectangular shapes for coating of larger substrates that pass under the target became available (e.g. as described in U.S. Pat. No. 3,878,085). Such elongated planar targets are now commonly used in dedicated 'display coaters' for the manufacturing of flat panel displays like liquid crystal displays (LCD) and plasma screens. These planar targets are usually mounted in the access doors of the apparatus; the target surface being easily accessible (with doors open) and spanning the length of and even extending over the substrate width. In a display coater the substrate to be coated is held under a slant angle (7° to 15°) out of the vertical and leans on a conveying system. As the target must be parallel to the substrate in order to obtain a uniform coating, the target must be mounted under substantially the same angle.

Stationary targets are easy to cool and energise (as they are static with respect to the apparatus), but they have the disadvantage that the target material is only eroded away beneath the racetrack. The useable lifetime of the target thus being limited to that point in time just before the target is first punctured. The problem of non-uniform erosion can be dealt with by introducing a magnet array that rotates relative to the target surface (such as e.g. introduced in U.S. Pat. No. 4,995,958 for circular planar magnetrons) or that translates relative to the target surface (such as e.g. described in U.S. Pat. No. 6,322,679 for elongated planar magnetrons). Such constructions—although alleviating the uneven erosion problem to a great extent—make the system more complex.

Large area coaters to coat e.g. window glass with all kinds of stacks of functional coatings are usually equipped with a rotating, tubular sputtering target. In this application the economic driver is throughput at a low material cost and a good quality. Rotating tubular targets are the ideal choice for that, as they can span large widths and can be used for a long period of time. The trade-off is that the target itself is rotating relative to the apparatus and hence a complex and space occupying 'end-block' is needed to bear, rotate, energise, cool and isolate (coolant, air and electricity) the rotating target while holding the magnet array fixed inside. Two types of arrangement exist:

Double, right-angled end-blocks such as disclosed in U.S. Pat. No. 5,096,562 (FIG. 2, FIG. 6) and US 2003/0136672 A1 wherein the means for bearing, rotating, energising, cooling and isolation (air, coolant and electrical) are divided between two blocks, situated at either end of the target. With right-angled is meant that the end-blocks are mounted to the wall that is parallel to the rotation axis of the target. These end-blocks are usually mounted at the bottom of a top-box containing ancillary equipment. The top-box with end-blocks and mounted target can be lifted in its entirety out of the large area coater for easy target replacement and servicing.

Single, straight-through end-blocks such as disclosed in U.S. Pat. No. 5,200,049 (FIG. 1) wherein the means for bearing, rotating, energising, cooling and isolation are all incorporated in one end-block and the target is held cantilevered inside the large area coater. With 'straight-through' is meant that the rotation axis of the target is perpendicular to the wall on which the end-block is mounted. 'Semi-cantilevered' arrangements are also described (U.S. Pat. No. 5,620,577) in that the end of the target farthest from the end-block is held by a mechanical support (without any other functionalities incorporated in that support).

Although rotatable targets could have many advantages when used for display coaters (increased uptime, nearly 100% target usage) the mounting of these targets poses problems:

Either one opts for a single or double right-angle end-block that is mounted to the door. But in that case a substantial part of the door length is occupied by the end-blocks, so that the usable target length does not span the width of the substrate.

Or one opts for a single straight-trough end-block, but in that case, radical modification of the display coater is needed inhibiting the introduction of such an end-block.

One is thus faced with a dimensional constraint problem. A first possible solution—described in WO 2005/005682 A1—reduces the width of the end-blocks by incorporating their functionalities inside the target tube. Although this solution is perfectly well possible the inventors sought for further possibilities in size reduction and came up with the invention, described in what follows, that solves the dimensional constraint problem.

SUMMARY OF THE INVENTION

It is a general object of the invention to reduce or eliminate the problems associated with the prior art. It is an object of the invention to make rotating sputtering targets available to display coaters, either as original equipment or as a retrofit to existing installations. It is a further object of the invention to reduce the end-block's length in the direction of the rotation axis of the target i.e. to provide a 'flat' end-block. According another aspect of the invention, a sputtering apparatus is provided that uses flat end-blocks.

While thinking about a solution to the problem, it struck the inventors that all prior-art—such as U.S. Pat. No. 5,096,562, U.S. Pat. No. 5,200,049, US 2003/0173217—hitherto mounted the different means for bearing, rotating, energising, cooling and isolation (air, coolant and electrical), nicely one after the other along the rotation axis of the target tube inside an end-block. Out-of-the-box thinking brought them to the basic principle of putting these means substantially radial to one another, in order to save space in the rotation axis direction. This new way of designing end-blocks is described in the claims attached that will now be explained in more detail.

A first aspect of the invention relates to the end-block.

An end-block is described. Such an end-block links the sputtering target in the sputtering apparatus to the outside of the sputtering apparatus. Such an end-block is preferably mountable as a single unit on a sputtering apparatus, although a wall-integrated end-block could be envisaged as well. Within an end-block the pressure is higher than in the evacuable apparatus, preferably the pressure is atmospheric. Means that are removable with the target tube or the removable magnet bar assembly are considered as not to belong to the end-block. The primary function of the end-block is to carry and to revolve the target around an axis of rotation. As sputtering is performed under a low gas pressure, the end-block must be gastight at all times and surely when it is rotating. As the sputtering of the target generates a lot of heat on the target surface, the target must be cooled which is normally done with water or another suitable coolant. This coolant must be fed and evacuated through the end-block. Also the target must be fed with an electrical current in order to maintain the target above a certain electric potential. Again this electrical current must pass through the end-block. In order to incorporate all these functions, an end-block may comprise different means:

A.) A drive means to make the target rotate. Preferably this is done by means of worm-gear system, or a cylindrical gear-gear system or a conical gear-gear crossed axis system, or a pulley-belt system, or any other means known in the art to make the target rotate. Any type of drive means will occupy a certain range on the rotation axis. The drive means range is defined by the interval on the rotation axis between the two intersection points of two planes that are perpendicular to that rotation axis, the planes confining the driven gear or pulley that turns at the same rotational speed as the target. In the case of a gear these planes define the largest width of the gearwheel. In the case of a pulley these planes define the width of the pulley.

B.) A rotatable electrical contact means to provide electrical current to the target. This is preferably achieved by means of an electrical commutator equipped with brushes that are in sliding contact with a commutator ring. Instead of a brush-and-ring arrangement, also two rings sliding against each other can be used, or a conducting belt type of connection can be used such as a metallic belt. The latter solution conveniently combines the drive means radial to the electrical contact means. In any case this rotatable electrical contact means will occupy a certain range on the rotation axis, a range that can again be defined by the intersection points of two planes with the rotation axis, the planes being perpendicular to the rotation axis.

C.) A number of bearing means. Depending on the weight of the target, more than one bearing means may be necessary. The person skilled in the art will readily select that type of bearings that are appropriate from the different types known such as ball bearings, roller bearings, plain bearings, axial bearings or any other type known in the art. As there may be a number of bearing means needed, each of them will define a bearing means range on the axis of rotation. Again, a bearing means range is defined as the interval between the intersection points on the rotation axis of two planes perpendicular to the rotation axis that confine that bearing means.

D.) A number of rotatable coolant seal means. These coolant seals ensure that coolant will not leak into the end-block or—even worse—into the vacuum apparatus while fixed and rotatable parts of an end-block turn relative to one another. In order to reduce this risk, a number of coolant seals are introduced in cascade. A coolant detector is sometimes introduced between the primary and secondary seal in order to detect leaks, and to allow controlled shutdown of the machine. Typically lip seals are used as coolant seal as they are well known in the art. However, other types—without being exhaustive—of seals like mechanical face seals or labyrinth seals are not excluded. As before, each of the coolant seal means defines a coolant seal means range between the intersection points with the rotation axis of two parallel planes that delimit the coolant seal and are perpendicular to the rotation axis.

E.) Finally a number of rotatable vacuum seal means are needed. These vacuum seals ensure the integrity of the vacuum while fixed and rotating parts of the end-block rotate relative to one another. A cascading series of vacuum seals—progressively protecting the vacuum—is preferred in order reduce the risk of having a vacuum leak. Again different seals are known of which the lip seal is most popular although other types of new seals—such as ferrofluïdic seals—can of course be used as well. Likewise, each of the vacuum seal means defines a vacuum seal means range that covers the interval between two points defined by the intersection of two parallel planes that are perpendicular to the rotation axis and that delimit the vacuum seal.

Apart from the above, the end-block will also have some means to hold the magnetic array—that is introduced into the target tube prior to mounting it on the end-block—in a stationary position, while the target tube revolves around it. At the other end of the magnet array, a bearing means usually holds the array centred with respect to the target tube.

The inventive end-block comprises at least two of the above-identified five means (A, B, C, D and E). Hence, the inventive end-block may comprise a subset of those means as long as there are two or more of them in the subset while the other means or incorporated in another end-block (this adds up to exactly 14 technologically meaningful subsets). The set of all five means is also considered as a subset.

The basic idea of mounting these different means radially instead of longitudinally (one after the other) can now be expressed conveniently. Two means are considered to be mounted radially relative to one another when the two ranges corresponding with those means overlap with one another on the axis of rotation. The overlapping between the ranges can be partial, i.e., when both ranges only have a part in common. Or it can be complete, in which case one means is completely covered, either radially inward or radially outward by the other means. In the inventive end-block, at least two means overlap one another. It is thus not excluded that more than one pair of overlapping means are present, for example, that two pairs of overlapping means exist within one single end-block (which implies of course that three means must be present within the end-block). It is also not excluded that three means overlap one another (which is equivalent to three pair-wise overlaps). The person skilled in the art will readily realise that building more means radially, the maximum being of course five, can reduce the axial length of the end-block further.

Particularly useful subsets of means comprised in an end-block are described wherein each time at least two different means are mounted radial to one another.

In a first preferred embodiment, the drive means (A), the electrical contact means (B) and coolant seal means (D) are combined in a single end-block (other means being implemented in e.g. the end-block at the other end of the target). With this preferred combination the minimum means for having all interconnections (coolant, electricity, movement) through a single end-block are present. At least two of the mentioned means must overlap one another.

A second preferred subset comprises the drive means (A), bearing means (C) and vacuum seal means (E) in a single end-block (the other block must than accommodate for the remaining means). Such a block is described in U.S. Patent App. Pub. No. 2003/0136672, FIG. 3. Again at least two means must overlap in order to have an end-block according the invention. More pairs of overlapping means are not excluded.

In a third claimed subset, the end-block houses the rotatable electrical contact means (B), the bearing means (C) and the vacuum seal means (E) compactly. At least two of the means must overlap, more overlaps of course not being excluded.

A fourth subset incorporates the bearing means (C), the rotatable coolant seal means (D) and the rotatable vacuum seal means (E) in a single end-block (a combination depicted e.g. in U.S. Pat. No. 5,096,562, FIG. 6, left block). The inventive concept requires that at least two, and possibly more, of them must pair-wise overlap.

A fifth subset incorporates four means namely the drive means (A), the bearing means (C), the rotatable coolant seal means (D) and the rotatable vacuum seal means (E) into a single end-block (much like U.S. Pat. No. 5,096,562, FIG. 2, left block). The inventive end-block has at least two out of the four means in an overlapping position, more overlapping pairs of means being possible as well.

A sixth subset embodies a drive means (A), a rotatable electrical contact means (B), a bearing means (C) and a rotatable vacuum seal means (E) in a single end-block (cfr. U.S. Pat. No. 5,096,562, FIG. 6, right block). Again in the inventive end-block, at least two of the means are mounted radially and overlapping. Likewise more pairs of overlapping means are possible.

A seventh subset comprises the rotatable electrical contact (B), the bearing means (C), the rotatable coolant seal (D) and the rotatable vacuum seal (E) in one end-block (as in U.S. Patent App. Pub. No. 2003/0136672, FIG. 6). According to the inventive concept at least two out of the four means must be situated in an overlapping position. However, more pairs of overlapping means are equally well possible, the maximum being six.

Finally an eighth subset comprises all means—the drive means (A), the rotatable electrical contact means (B), the bearing means (C), the coolant seal means (D) and the vacuum seal means (E)—in a single end-block (FIG. 1 of U.S. Pat. No. 5,200,049). It is not excluded that the other end is held by a bearing means. At least two means must be arranged radial according the inventive concept, but it applies equally well if more pairs of overlapping means are present.

For some subsets of means, only a number of overlapping pairs are possible. In a first preferred combination, at least the drive means range and the electrical contact means range overlap. In a second combination, the drive means and the bearing means are mounted radial to one another. A preferred compact embodiment has the drive means being radial with respect to the coolant seal. Alternatively, the vacuum seal can be mounted radial with respect to the drive means. Preferred combinations define where one of the group consisting of the bearing means, the coolant seal and the vacuum seal is situated radial to the electrical contact means, thus compact embodiments are easy to implement. A combination of radially mounted bearing means and coolant means or bearing means and vacuum seal means is fairly easy to implement and thus preferred to compact the end-block. The same applies to the radial combination of coolant seal means and vacuum seal means.

Again, the combinations do not exclude the possibility that more than one pair of means overlap in a single end-block. Even more overlaps are possible in a single end-block e.g. three means radial to one another. Indeed it is perfectly well possible—for example—to mount the bearing means, the electrical contact means and the coolant sealant radial to one another as will be demonstrated in the embodiments.

The end-block according the invention can be of the right-angled type wherein the axis of rotation of the target is parallel to the wall on which the end-block is mounted. Or it can be of the straight-through type i.e. wherein the axis of rotation of the target is perpendicular to the wall.

A second aspect of the invention relates to the sputtering apparatus using the inventive end-block.

As was explained in the objects of the invention, the end-blocks according the invention are particularly intended—without being limited thereto—to be mounted inside a sputtering apparatus such as a display coater. Such a sputtering apparatus has an evacuable space delimited by walls. The sputtering apparatus with the inventive end-block or end-blocks situated on one of these walls is particularly described. More preferred is that the end-block(s) is (are) mounted on a removable wall of the chamber for ease of servicing. Most preferred is if the end-block(s) is (are) mounted on an access door.

BRIEF DESCRIPTION OF THE DRAWINGS

The invention will now be described into more detail with reference to the accompanying drawings wherein FIG. 1A shows a schematic, perspective view of a display coater FIG. 1B shows schematic cross section of a display coater perpendicular to the substrate travelling direction FIG. 2 shows a schematic embodiment of an end-block incorporating all necessary means and having a large degree of overlaps.

DESCRIPTION OF THE PREFERRED EMBODIMENTS OF THE INVENTION

Figure 3:
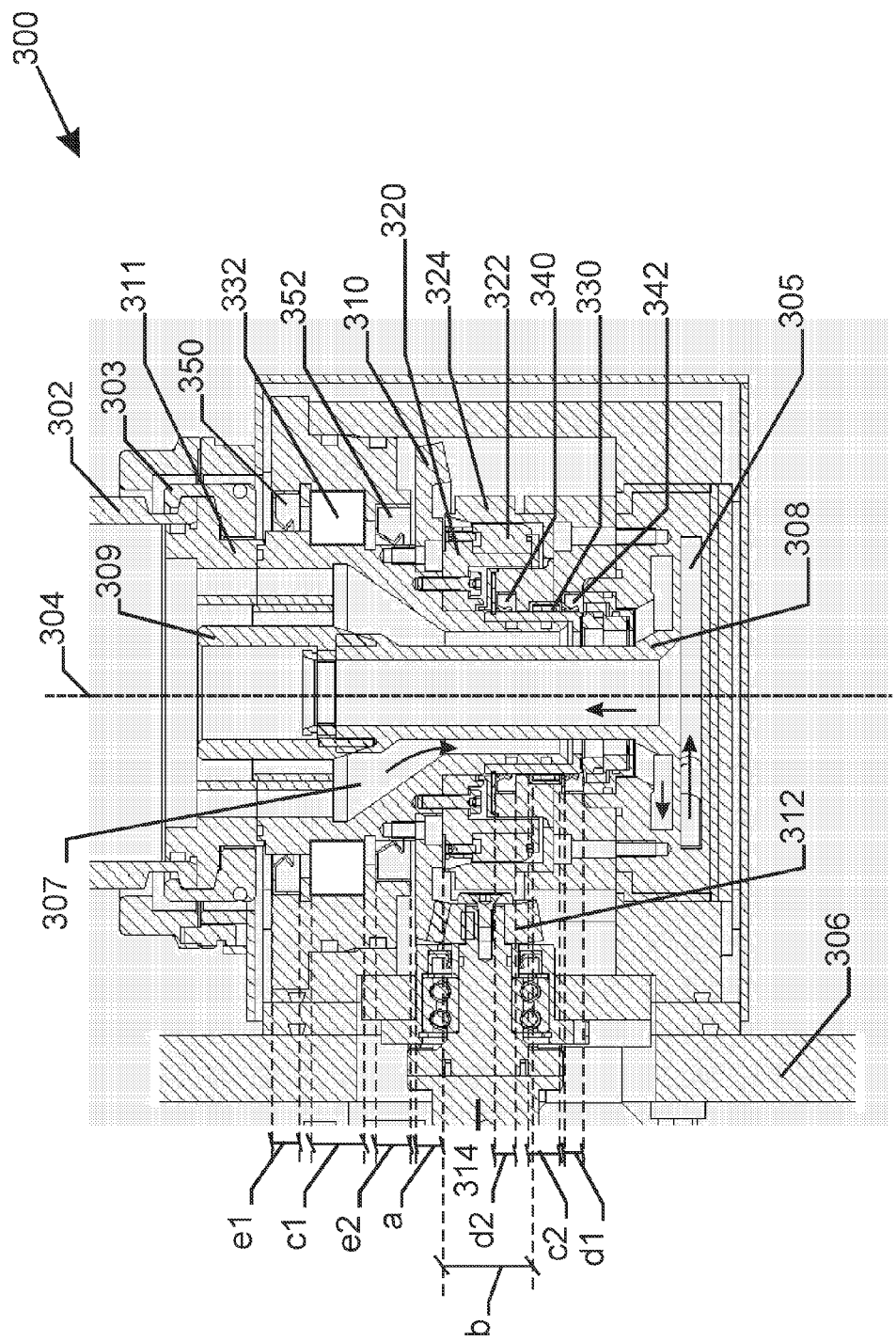
FIG. 3 shows a design cross section wherein the rotatable electrical contact means overlaps the coolant seal means and partially overlaps the bearing means.

FIGS. 1A and B, are illustrative to the problem the invention solves. FIG. 1A depicts schematically an opened sputtering apparatus 10 that is substantially vertically oriented like display coaters normally are. FIG. 1B shows a cross section of the same apparatus 10 with door closed. Such an apparatus 10 comprises an evacuable chamber 100. Such a chamber 100 may be part of a production line that can be interconnected through locks 101 that allow the chamber 100 to be isolated from the rest of the line. In the chamber 100, substrates 102 are conveyed sequentially by means of a conveyor system 104. Substrates 102 are leaning under a slant angle on a series of rollers 105. The door 106 of the chamber 100 holds one, two or more rotatable targets 108, 108'. Upon closure of the door (FIG. 1B) the targets 108, 108' become parallel to the substrate 102. Each of the targets 108, 108' is held on the door by means of two end-blocks 110, 112 (for 108) and 110', 112' (for 108'). An end-block 110, 112 is the connector between the rotatable target 108 and the stationary chamber. Its primary function is to allow the target 108 to rotate around its axis of rotation 111. Within the end-block there is no low-pressure regime i.e. by preference there is atmospheric pressure. The different means (A, B, C, D and E) must be incorporated in either a single end-block (either the lower 110, or the upper 112) or distributed over two end-blocks 110, 112 at both ends of the target. Means that are incorporated in the low-pressure part of the apparatus are not considered to be means part of an end-block. In the case of a single end-block for example, a centring pin mounted to the door 106 at the target-end opposite to the target-end that is connected to the end-block is not considered to be an end-block. Through the end-block, rotational movement 120, target current 122 and coolant 124 is fed to the target.

FIG. 2 shows as schematic drawing of a first preferred embodiment of an end-block according the invention. The end-block 200 incorporates all means (A, B, C, D and E) inside a single housing 201. It is of the right-angled type and can be mounted to the wall or the door 202 of a coater holding the upper end of the target 220. The target 220 is able to rotate around its axis of rotation 222. The target 220 is connected to a holder ring 226 by means of connector 224. The target coolant tube 230—carrying the not shown magnet bar—is connected through the coolant feed tube 228 through a connector 232. The coolant feed tube 228 is firmly and fixedly attached to the end-block housing 201. The coolant is fed through coolant feed 234 into coolant tube 228. The coolant is collected in a stationary coolant collector 229, coaxial to the coolant tube 228 and is extracted through tube 236.

The target 220 is rotary driven by the gear wheel 204 through the holder ring 226 thus providing a drive means (A). The gear teeth engage with a worm shaft 205 that on its turn is driven by e.g. an electrical motor (not shown). A mounting ring 207 holds an axial bearing 208 functioning as a bearing means (C). A rotatable electrical contact means (B) is provided by a series of brushes 206 mounted as annular segments coaxial to the rotation axis 222. These brushes 206 are spring mounted in an electrically conductive ring 290 and slide against a slide ring 203. The brushes 206 receive electrical current through the conductive ring 290 that on its turn is fed by the electrical lead 209. The sliding ring 203 is in electrical contact with the target 220 through the gear 204 and the holder ring 226. Two rotatable vacuum seal means (E) are provided by the lip seals 212. The rotatable coolant seal means (D) is incorporated by the coolant seal 210 that is a labyrinth seal. The coolant seal 210 is mounted between the holder ring 226 and the coolant collector 229.

Each of the above means occupies some length along the axis of rotation. For example, the width of the gear wheel 204 occupies a range 'a' as indicated in FIG. 2. The range 'a' is defined as that interval on the rotation axis formed by the intersection points of two planes that delimit the gear wheel 204 and are perpendicular to the rotation axis with the same rotation axis. Likewise the other means will occupy a certain range on the rotation axis:

The rotatable electrical contact means (B) occupies a range 'b' that is as wide as the axial width of the brushes 206, and rings 203, 290.

The bearing means (C) occupies a range 'c' covered by the bearing 208.

The coolant seal means (D) occupies a range 'd' corresponding to the coolant seal 210.

The vacuum seal means (E) covers two ranges 'e1' and 'e2' on the rotation axis, as there are two vacuum seals 212.

One does get—in line with the inventive concept—the following overlap of ranges (Table 1):

TABLE 1

| Range | a | b | c | d | e1 | e2 |
|---|---|---|---|---|---|---|
| a |   | P |   | P |   |   |
| b |   |   | F | F |   |   |
| c |   |   |   | F |   |   |
| d |   |   |   |   | F |   |
| e1 |   |   |   |   |   |   | wherein 'P' denotes a Partial overlap and 'F' denotes a Full overlap. An empty cell indicates no overlap at all. The person skilled in the art will readily appreciate that the above arrangement leads to an end-block that does not take much space along the longitudinal axis of rotation.

FIG. 3 shows an engineering drawing incorporating the features of the inventive end-block. Such a detailed drawing enables the person skilled in the art to manufacture the end-block. In order not to burden the disclosure, parts of which the function is obvious will not be identified or denominated. A part like fixing means—such as screws, bolts or the like—or stationary sealing means—such as O-rings—will be readily recognised by the person skilled in the art on the drawing.

The inventive end-block 300 carries a (partly shown) target 302 around an axis of rotation 304. The target 302 is removably fixed to the end-block through mounting ring 303. The mounting ring is attached to a rotatable intermediate piece 311. The end-block 300 is attached to the wall 306 of a sputtering installation. The end-block has cavities for feeding 305 and extracting coolant 307, the arrows indicating the flow direction of the coolant. The magnet bar (not shown) is held stationary through a connector 309 that tangentially locks into the inner tube 308 that is fixedly connected inside the end-block 300.

The target 302 is driven by a crossed axis, conical gear pair 310-312 whereby gear 312 is actuated by an electrical motor (not shown) through axis 314. The main gear 310 is fixed to the target 302 through rotatable intermediate piece 311. Also attached to the intermediate piece 311 is a commutator ring 320 comprising six brushes 322 that are segment wise distributed over the circumference of the ring 320. The brushes 322 slide against the inside of the stationary contacting ring 324. The target 302 therefore receives its current from the current source (not shown) through leads (not shown), the contacting ring 324, the brushes 322, commutator ring 320 and intermediate piece 311. The target is rotatably carried by two bearings: a ball bearing 332 and a needle bearing 330. The coolant is held in the circuit by two rotary lip seals: the primary seal 342 and the secondary seal 340. Vacuum integrity of the end-block is ensured through two rotary lip seals 350 and 352.

Again the different ranges associated with these means can be identified. They are summarised in Table 2. Small letters refer to the ranges as indicated in FIG. 3.

TABLE 2

| Part | Range | a | b | c1 | c2 | d1 | d2 | e1 | e2 |
|---|---|---|---|---|---|---|---|---|---|
| 310 | a |   |   |   |   |   |   |   |   |
| 320 | b |   |   |   | P |   | F |   |   |
| 332 | c1 |   |   |   |   |   |   |   |   |
| 330 | c2 |   |   |   |   |   |   |   |   |
| 342 | d1 |   |   |   |   |   |   |   |   |
| 340 | d2 |   |   |   |   |   |   |   |   |
| 350 | e1 |   |   |   |   |   |   |   |   |
| 352 | e2 |   |   |   |   |   |   |   |   |

Here the same meaning has been used as in Table 1 for the letters P, F and the empty cell likewise denotes the absence of an overlap. It will be clear from the table that—although the different means only show a small degree of overlapping—the end-block of FIG. 3 still falls under the same inventive concept of mounting the means radial to one another.

Figure 4:
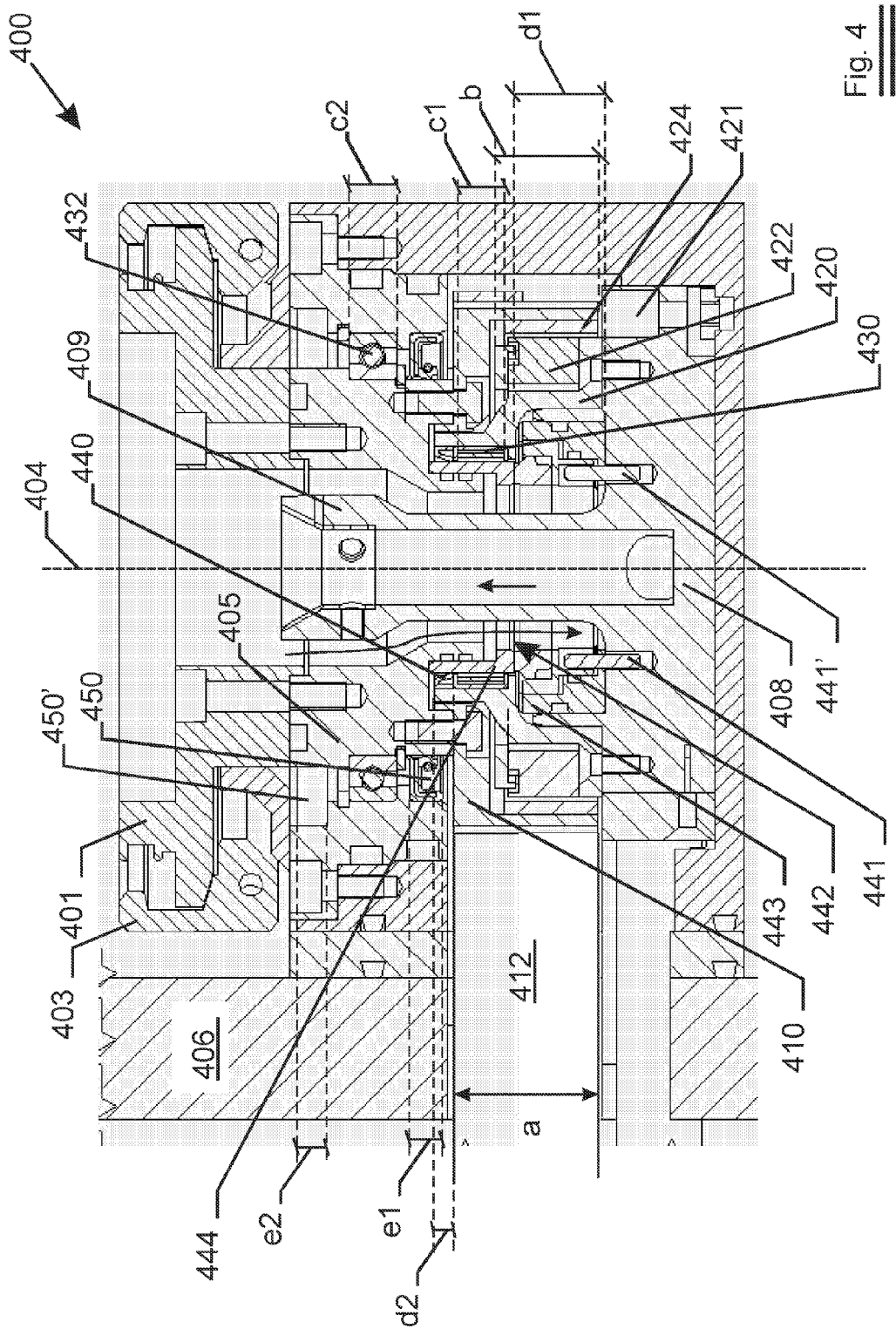
FIG. 4 shows a design cross section wherein the drive means overlaps the rotatable electrical contact means that on its turn overlaps the primary coolant seal means, the drive means also overlapping the bearing means.

FIG. 4 shows a third preferred embodiment of the invention. The end-block 400 is provided with a connector ring 403 to fixedly but removably connect the target tube (not shown) with the target receiving flange 401. The target tube (not shown) is rotated by the flange 401 around the axis of rotation 404. Coolant is fed to the target (not shown) through an electrically insulating inner body 408. The end of the inner body 408 is provided with a fitting 409 that matches with the magnet bar insert (not shown) that holds the magnet bar stationary with respect to the rotating target. The coolant follows the direction of the arrows. The end-block 400 is to be mounted on the wall 406 of the sputtering apparatus.

The target (not shown) is driven by a toothed belt 412 that engages with a toothed wheel 410. This toothed wheel connects to the 401 target receiving flange through intermediate piece 405. Inside this toothed wheel 410, there is provided a stationary commutator 420 fixed to a connecting electrode 421 that is embedded in the inner body 408. The commutator is provided with six brushes 422, each covering a segment of the circumference of the commutator 420. The brushes are spring mounted and slide against the inner ring 424 fixed inside the toothed wheel 410. The current thus follows the following path from current source (not shown) to target (not shown): electrode 421, stationary commutator ring 420, stationary brushes 422, rotating ring 424, toothed wheel 410, intermediate piece 405, target receiving flange 401. A needle bearing 430 and a larger ball bearing 432 provide the necessary bearing means. A mechanical seal cassette 443 provides a first coolant seal. Such a cassette has two rings of equal diameter that are axially pressed against on another. The contacting faces are polished so precisely that no coolant can escape through the contacting faces 442. The one side of the mechanical seal cassette 443 is tangentially locked in position by means of the pins 441, 441'. The facing tungsten carbide ring 444 tightly fits the rotating intermediate piece 405 and is sealed from the coolant flow by means of two stationary O-rings. A secondary lip seal 440 further secures coolant circuit integrity. Vacuum integrity is ensured through primary vacuum lip seal 450' and secondary lip seal 450.

Again a table—table 3—can be drawn up that summarises the overlapping regions of this design. The various ranges occupied on the axis of rotation by the different means are identified by the small letters—a, b, c1, c2, d1, d2, e1, e2—on FIG. 4.

TABLE 3

| Part | Range | a | b | c1 | c2 | d1 | d2 | e1 | e2 |
|------|-------|---|---|----|----|----|----|----|----|
| 410 | a | | F | F | | F | | | |
| 422 | b | | | P | | P | | | |
| 430 | c1 | | | | | | | | |
| 432 | c2 | | | | | | | | |
| 443 | d1 | | | | | | | | |
| 440 | d2 | | | | | | | P | |
| 450 | e1 | | | | | | | | |
| 450' | e2 | | | | | | | | |

This third embodiment therefore clearly embodies the inventive concept as put forward by the inventors.

The embodiments described above have all the necessary means incorporated in one single end-block. The other end of the end-block can thus be left free standing or held centred by means of a centring pin connected to the same wall as the wall the end-block is mounted on.

The person skilled in the art will have little trouble to redistribute the means necessary to make the apparatus operate over two end-blocks—one at each end of the target—by taking these preferred embodiments and eliminating specific means out of them. It will be readily understood that as long as these amended embodiments do show overlapping means, that they fall under the scope of the invention.

Likewise all of the end-blocks described are of right-angled type, i.e. the axis of rotation is parallel to the wall the end-block is mounted on. The person skilled in the art will have little trouble in converting these right-angled types to straight-through types i.e. end-blocks where the axis of rotation is perpendicular to the wall the end-block is mounted on. For example the embodiment of FIG. 4 can be readily adapted by elongating the intermediate piece 405 so that enough space is available to mount the end-block with the target oriented face to the wall of the sputtering apparatus (with the introduction of the necessary O-rings and fixing means).

Accordingly, it is intended that the claims cover all such alterations and modifications that fall within the true spirit and scope of the invention.

The invention claimed is:

1. An end-block for rotatably carrying a target around an axis of rotation in an evacuable sputtering apparatus, said end-block comprising a subset of at least two of the following means:
   a driven means for providing a driving force of rotation to the target, said driven means covering a driven means range on said axis, said driven means range being defined as a perpendicular projection of said driven means on said axis;
   a rotatable electrical contact means covering a contact means range on said axis, said contact means range being defined as a perpendicular projection of said contact means on said axis; and
   a number of coolant seal means that are relative rotatable between fixed and rotatable parts, the number of coolant seal means covering corresponding coolant seal means ranges on said axis, said coolant seal means ranges being defined as perpendicular projections of said corresponding coolant seal means on said axis;
   wherein at least two different means out of said subset of means are arranged radially to one another, so that at least two ranges corresponding to said at least two different means overlap one another on said axis; and
   wherein said driven means is one of a pulley of a pulley-belt system, a driven gear of a worm-gear system, a driven gear of a cylindrical gear-gear system, or a driven gear of a conical gear-gear crossed axis system.

2. The end-block according to claim 1, wherein said subset comprises the following means:
   the driven means covering the driven means range on said axis, said driven means range being defined as the perpendicular projection of said driven means on said axis;
   the rotatable electrical contact means covering the contact means range on said axis, said contact means range being defined as the perpendicular projection of said contact means on said axis; and
   the number of coolant seal means, the number of coolant seal means covering the corresponding coolant seal means ranges on said axis, said coolant seal means ranges being defined as the perpendicular projections of said corresponding coolant seal means on said axis.

3. The end-block according to claim 1, further comprising a number of bearing means, the number of bearing means covering corresponding bearing means ranges on said axis, said bearing means ranges being defined as perpendicular projections of said corresponding bearing means on said axis.

4. The end-block according to claim 3, wherein said at least two different overlapping means out of said subset of means furthermore overlap on said axis with the number of bearing means.

5. The end-block according to claim 1, further comprising a number of vacuum seal means, the number of vacuum seal means covering corresponding vacuum seal means ranges on said axis, said vacuum seal means ranges being defined as perpendicular projections of said corresponding vacuum seal means on said axis.

6. The end-block according to claim 5, wherein said at least two different overlapping means out of said subset of means furthermore overlap on said axis with said number of vacuum seal means.

7. The end-block according to claim 1, wherein said driven means range overlaps with said contact means range.

8. The end-block according to claim 3, wherein said driven means range overlaps with at least one of said bearing means ranges.

9. The end-block according to claim 1, wherein said driven means range overlaps with at least one of said coolant seal means ranges.

10. The end-block according to claim 5, wherein said driven means range overlaps with at least one of said vacuum seal means ranges.

11. The end-block according to claim 3, wherein said contact means range overlaps with at least one of said bearing means ranges.

12. The end-block according to claim 1, wherein said contact means range overlaps with at least one of said coolant seal means ranges.

13. The end-block according to claim 5, wherein said contact means range overlaps with at least one of said vacuum seal means ranges.

14. The end-block according to claim 3, wherein at least one of said bearing means ranges overlaps with at least one of said coolant seal means ranges.

15. The end-block according to claim 5, wherein at least one of said coolant seal means ranges overlaps with at least one of said vacuum seal means ranges.

16. The end-block according to claim 1, wherein said end-block is configured to rotatably carry the target, said target having the axis of rotation, said end-block being configured for mounting on a wall of a sputtering apparatus, wherein said rotation axis is substantially parallel to said wall.

17. The end-block according to claim 1, wherein said end-block is configured to rotatably carry the target, said target having the axis of rotation, said end-block being configured for mounting on a wall of a sputtering apparatus, wherein said rotation axis is substantially perpendicular to said wall.

18. A sputtering apparatus comprising walls for providing an evacuable space, said apparatus further comprising an end-block mountable to one of said walls, said end-block having the features of claim 1.

19. The sputtering apparatus as claimed in claim 18, wherein said one of said walls on which said end-block is mounted is removable.

20. The sputtering apparatus as claimed in claim 19, wherein said removable wall is hinge jointed to said apparatus.

21. An end-block for rotatably carrying a target around an axis of rotation in an evacuable sputtering apparatus, said end-block comprising a subset of at least two of the following members:
  a driven member configured to provide a driving force of rotation to the target, said driven member covering a driven range on said axis, said driven range being defined as a perpendicular projection of said driven member on said axis;
  a rotatable electrical contact covering a contact range on said axis, said contact range being defined as a perpendicular projection of said contact on said axis; and
  a coolant seal that is relative rotatable between fixed and rotatable parts, and that covers a coolant seal range on said axis, said coolant seal range being defined as a perpendicular projection of said coolant seal on said axis;
  wherein at least two members of the subset are arranged radially to one another such that at least two ranges corresponding to said at least two members overlap one another on said axis; and
  wherein said driven member is one of a pulley of a pulley-belt system, a driven gear of a worm-gear system, a driven gear of a cylindrical gear-gear system, or a driven gear of a conical gear-gear crossed axis system.

22. The end-block according to claim 21, wherein said subset comprises at least three of the following: the driven member; the rotatable electrical contact; the coolant seal; a bearing for carrying said target and covering a bearing range on said axis, said bearing range being defined as a perpendicular projection of said bearing on said axis; and a vacuum seal that is relative rotatable between fixed and rotatable parts, and that covers a vacuum seal range on said axis, said vacuum seal range being defined as a perpendicular projection of said vacuum seal on said axis.

23. The end-block according to claim 21, wherein said subset comprises at least four of the following: the driven member; the rotatable electrical contact; the coolant seal; a bearing for carrying said target and covering a bearing range on said axis, said bearing range being defined as a perpendicular projection of said bearing on said axis; and a vacuum seal that is relative rotatable between fixed and rotatable parts, and that covers a vacuum seal range on said axis, said vacuum seal range being defined as a perpendicular projection of said vacuum seal on said axis.

24. The end-block according to claim 21, wherein said subset comprises the driven member; the rotatable electrical contact; the coolant seal; a bearing for carrying said target and covering a bearing range on said axis, said bearing range being defined as a perpendicular projection of said bearing on said axis; and a vacuum seal that is relative rotatable between fixed and rotatable parts, and that covers a vacuum seal range on said axis, said vacuum seal range being defined as a perpendicular projection of said vacuum seal on said axis.

* * * * *